(12) United States Patent
Dening et al.

(10) Patent No.: US 7,330,071 B1
(45) Date of Patent: Feb. 12, 2008

(54) HIGH EFFICIENCY RADIO FREQUENCY POWER AMPLIFIER HAVING AN EXTENDED DYNAMIC RANGE

(75) Inventors: David Dening, Stokesdale, NC (US); Kathleen Muhonen, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 191 days.

(21) Appl. No.: 11/253,321

(22) Filed: Oct. 19, 2005

(51) Int. Cl.
*H03G 3/20* (2006.01)

(52) U.S. Cl. .................. 330/127; 330/124 R; 330/295

(58) Field of Classification Search ............ 330/124 R, 330/127, 129, 295, 297
See application file for complete search history.

(56) References Cited

U.S. PATENT DOCUMENTS

| | | | |
|---|---|---|---|
| 4,446,440 A | 5/1984 | Bell | 330/10 |
| 4,701,957 A | 10/1987 | Smith | 381/61 |
| 4,739,759 A | 4/1988 | Rexroth | 128/303.14 |
| 5,126,688 A | 6/1992 | Nakanishi et al. | 330/285 |
| 5,182,527 A | 1/1993 | Nakanishi et al. | 330/285 |
| 5,204,637 A | 4/1993 | Trinh | 330/129 |
| 5,251,330 A | 10/1993 | Chiba et al. | 455/91 |
| 5,276,917 A | 1/1994 | Vanhanen et al. | 455/89 |
| 5,438,683 A | 8/1995 | Durtler et al. | 455/74 |
| 5,442,322 A | 8/1995 | Kornfield et al. | 330/285 |
| 5,493,255 A | 2/1996 | Murtojarvi | 330/296 |
| 5,511,234 A | 4/1996 | Ha | 455/127 |
| 5,530,404 A | 6/1996 | Debroux | 330/278 |
| 5,530,923 A | 6/1996 | Heinonen et al. | 455/126 |
| 5,553,318 A | 9/1996 | Ohmagari et al. | 455/126 |
| 5,559,471 A | 9/1996 | Black | 330/277 |
| 5,561,395 A | 10/1996 | Melton et al. | 330/2 |
| 5,574,991 A | 11/1996 | Miyama et al. | 455/126 |
| 5,606,284 A | 2/1997 | Tamesue et al. | 330/129 |
| 5,608,353 A | 3/1997 | Pratt | 330/295 |
| 5,621,354 A | 4/1997 | Mitzlaff | 330/52 |
| 5,629,648 A | 5/1997 | Pratt | 330/289 |
| 5,715,527 A | 2/1998 | Horii et al. | 455/126 |
| 5,808,453 A | 9/1998 | Lee et al. | 323/224 |
| 5,828,692 A | 10/1998 | Walley et al. | 375/130 |
| 5,831,477 A | 11/1998 | Tsumura | 330/51 |

(Continued)

FOREIGN PATENT DOCUMENTS

EP    0 626 765 A1    11/1994

(Continued)

OTHER PUBLICATIONS

Hanington et al., "Microwave Power Amplifier Efficiency Improvement With a 10 MHz HBT DC-DC Converter," 1998 IEEE MTT-S International Microwave Symposium Digest, 1998.

(Continued)

*Primary Examiner*—Khanh Van Nguyen
(74) *Attorney, Agent, or Firm*—Withrow & Terranove, PLLC (57) ABSTRACT

A system and method are provided for efficiently amplifying a radio frequency signal. In general, the system includes power amplifier circuitry that efficiently amplifies an input signal under power back-off conditions. In one embodiment, the power amplifier circuitry has an efficiency of at least 30% at a 6 dB back-off point. In addition, DC-DC conversion circuitry operates to control a variable supply voltage provided to the power amplifier circuitry, thereby controlling an output power level, or average output power, of the power amplifier circuitry.

14 Claims, 5 Drawing Sheets

U.S. PATENT DOCUMENTS

| | | | | |
|---|---|---|---|---|
| 5,834,975 | A | 11/1998 | Bartlett et al. | 330/278 |
| 5,847,602 | A | 12/1998 | Su | 330/10 |
| 5,861,776 | A | 1/1999 | Swanson | 330/124 R |
| 5,862,461 | A | 1/1999 | Yoshizawa | 455/127 |
| 5,870,296 | A | 2/1999 | Schaffer | 363/65 |
| 5,872,481 | A | 2/1999 | Sevic et al. | 330/51 |
| 5,942,946 | A | 8/1999 | Su et al. | 330/310 |
| 5,973,556 | A | 10/1999 | Su | 330/10 |
| 5,977,833 | A | 11/1999 | Attimont et al. | 330/297 |
| 5,994,963 | A | 11/1999 | Kawai et al. | 330/277 |
| 6,002,923 | A | 12/1999 | Sahlman | 455/118 |
| 6,025,753 | A | 2/2000 | Landherr et al. | 330/285 |
| 6,043,707 | A | 3/2000 | Budnik | 330/10 |
| 6,049,704 | A | 4/2000 | Peckham et al. | 455/232.1 |
| 6,069,530 | A | 5/2000 | Clark | 330/149 |
| 6,101,224 | A | 8/2000 | Lindoff et al. | 375/300 |
| 6,137,274 | A | 10/2000 | Rajagopalan | 323/272 |
| 6,148,220 | A | 11/2000 | Sharp et al. | 455/572 |
| 6,160,855 | A | 12/2000 | Nakamura et al. | 375/280 |
| 6,188,877 | B1 | 2/2001 | Boesch et al. | 455/74 |
| 6,198,347 | B1 | 3/2001 | Sander et al. | 330/251 |
| RE37,407 | E | 10/2001 | Eisenberg et al. | 330/2 |
| 6,313,705 | B1 | 11/2001 | Dening et al. | 330/276 |
| 6,327,462 | B1 | 12/2001 | Loke et al. | 455/127 |
| 6,356,745 | B1 | 3/2002 | Lee et al. | 455/232.1 |
| 6,366,177 | B1 | 4/2002 | McCune et al. | 332/103 |
| 6,369,649 | B2 | 4/2002 | Nakajima | 330/51 |
| 6,374,127 | B1 | 4/2002 | Park | 455/572 |
| 6,377,784 | B2 | 4/2002 | McCune | 455/108 |
| 6,392,488 | B1 | 5/2002 | Dupuis et al. | 330/277 |
| 6,397,090 | B1 | 5/2002 | Cho | 455/574 |
| 6,405,054 | B1 | 6/2002 | Rozenblitz et al. | 455/522 |
| 6,414,469 | B1 | 7/2002 | Zhou et al. | 323/272 |
| 6,441,694 | B1 | 8/2002 | Turcotte et al. | 332/100 |
| 6,445,249 | B1 | 9/2002 | Khan et al. | 330/149 |
| 6,448,847 | B1 | 9/2002 | Paul et al. | 327/563 |
| 6,462,620 | B1 | 10/2002 | Dupuis et al. | 330/264 |
| 6,549,071 | B1 | 4/2003 | Paul et al. | 330/252 |
| RE38,140 | E | 6/2003 | Schaffer | 363/65 |
| 6,701,138 | B2 | 3/2004 | Epperson et al. | 455/127 |
| 6,734,724 | B1 | 5/2004 | Schell et al. | 330/10 |
| 6,844,776 | B2 | 1/2005 | Schell et al. | 330/10 |
| 6,969,978 | B2 | 11/2005 | Dening | 323/282 |
| 2001/0006355 | A1 | 7/2001 | Park | 330/285 |
| 2002/0002038 | A1 | 1/2002 | Seawright et al. | 455/127 |
| 2002/0077066 | A1 | 6/2002 | Pehlke et al. | 455/73 |
| 2002/0127980 | A1 | 9/2002 | Amanullah et al. | 455/127 |
| 2003/0054778 | A1 | 3/2003 | Hecht | 455/115 |
| 2003/0083026 | A1 | 5/2003 | Liu | 455/127 |
| 2003/0090325 | A1 | 5/2003 | Canyon et al. | 330/285 |
| 2004/0108900 | A1* | 6/2004 | Apel | 330/285 |
| 2007/0139105 | A1* | 6/2007 | Kennan | 330/124 R |

FOREIGN PATENT DOCUMENTS

| | | |
|---|---|---|
| JP | 61095603 | 5/1986 |
| JP | 5235657 | 9/1993 |

OTHER PUBLICATIONS

International Search Report for counterpart application PCT/US02/16636, mailed Dec. 2, 2003.

P. Asbeck et al., "Efficiency and Linearity Improvement in Power Amplifiers for Wireless Communications," University of California, San Diego, La Jolla, CA, IEEE 1998, pp. 15-18.

F. Raab et al., "Power Amplifiers and Transmitters for RF and Microwave," IEEE Transactions on Microwave Theory and Techniques, vol. 50, No. 3, pp. 814-826, Mar. 2002.

I. Hakala et al., "Chireix Power Combining with Saturated Class-B Power Amplifiers," Gallium Arsenide applications symposium. GAAS Oct. 11-12, 2004, Amsterdam.

S. Cripps, "Advanced Techniques in RF Power Amplifier Design," Artech House, Inc., ch. 2, pp. 33-72, 2002.

M. Iwamoto et al., "An Extended Doherty Amplifier With High Efficiency Over a Wide Power Range," IEEE Transactions on Microwave Theory and Techniques, vol. 49, No. 12, Dec. 2001.

* cited by examiner

HIGH EFFICIENCY RADIO FREQUENCY POWER AMPLIFIER HAVING AN EXTENDED DYNAMIC RANGE

FIELD OF THE INVENTION

The present invention relates to power amplifier circuitry and more specifically relates to high efficiency power amplifier circuitry for mobile applications having an extended dynamic range.

BACKGROUND OF THE INVENTION

Figure 1:
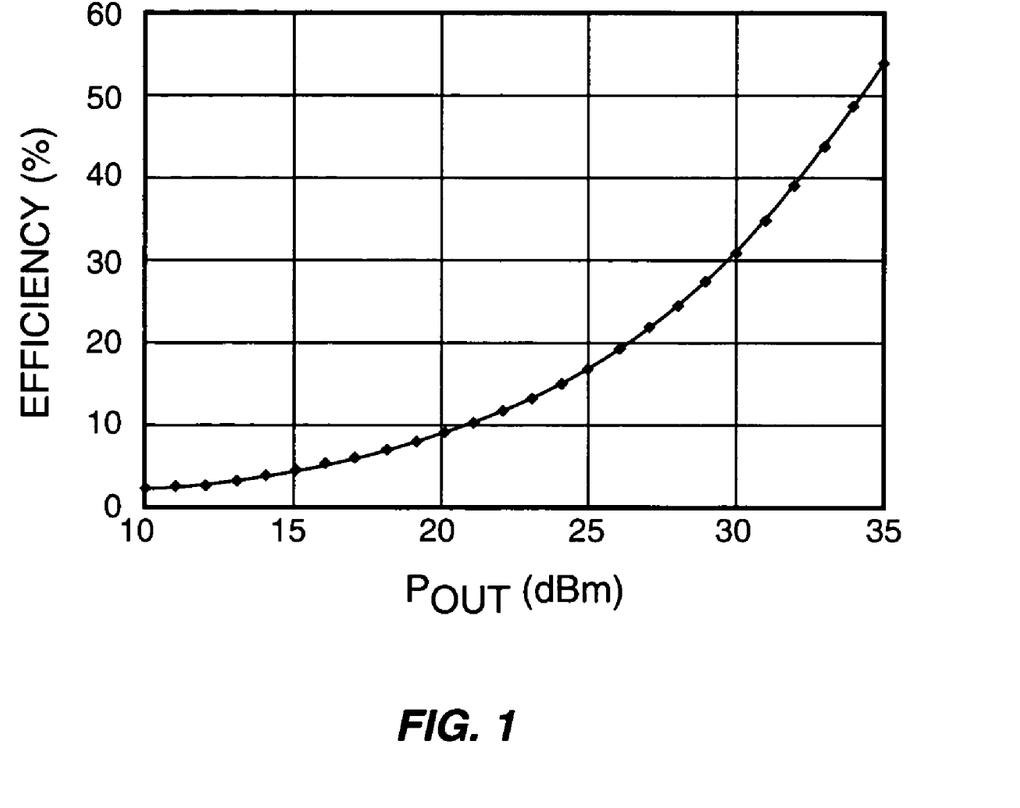
FIG. 1 is a graphical illustration of the efficiency versus output power characteristic of a typical power amplifier.

One of the primary goals in designing mobile telephones is to reduce power consumption in order to increase battery-life. In large part, the power consumption of a mobile telephone is dependent upon the radio frequency (RF) efficiency of a power amplifier in the transmit chain that operates to amplify a transmit signal prior to sending the signal to the antenna for transmission. In general, RF power amplifiers operate most efficiently when operating close to saturation. FIG. 1 illustrates efficiency versus output power performance for a typical power amplifier operating to amplify a constant amplitude signal such as a Gaussian Minimum Shift Keying (GMSK) modulated signal provided according to the Global System for Mobile Communications (GSM) standard. This follows the classic AB bias back-off efficiency. As the output power is backed-off from a maximum output power, the efficiency of the power amplifier decreases.

As mobile communication systems evolve to provide increased data rates and to accommodate larger numbers of users in a cell, new modulation and multiple access techniques are being employed to increase the capacity of the system. Typically, these techniques use larger numbers of phase and amplitude quantization points, thereby allowing more bits to be coded within a symbol, and give the signal multi-tone characteristics. As a result of these new techniques, the peak-to-average levels of the radio frequency input signal provided to the power amplifier have increased. When a modulated signal having a peak level that is larger than the average level is amplified, the operating point of the power amplifier is typically configured such that the peak level at the maximum output power level is close to the saturation point of the power amplifier. Thus, the average signal level is backed-off from the saturation level by the peak-to-average ratio. As such, the power amplifier operates at backed-off output power and reduced efficiency for the majority of the time when amplifying the input signal.

For example, if the power amplifier having the efficiency versus output power characteristic shown in FIG. 1 was used to amplify an input signal having a 5 dB peak-to-average ratio, the power amplifier would have to be configured such that, at a maximum output power level, the average output power was at 30 dBm in order to enable amplification of the 35 dBm peak signals without distortion. Thus, the average efficiency would drop to about 30%. As the output power level is reduced, the efficiency is further reduced. For example, if the output power level was reduced by 6 dBm, the average output power would be at 24 dBm, and the efficiency would drop to about 15%.

Thus, there remains a need for a system and method for amplifying radio frequency signals having large peak-to-average ratios with improved efficiency.

SUMMARY OF THE INVENTION

The present invention provides a system and method for efficiently amplifying a radio frequency signal. In general, the system includes power amplifier circuitry that efficiently amplifies an input signal under power back-off conditions. In one embodiment, the power amplifier circuitry has an efficiency of at least 30% at a 6 dB back-off point. In addition, a DC-DC converter operates to control a variable supply voltage provided to the power amplifier circuitry, thereby controlling an output power level, or average output power, of the power amplifier circuitry.

During operation, the power amplifier operates under the power back-off condition where the average output power of the power amplifier circuitry is less than a maximum output power for each output power level in order to accommodate a peak-to-average ratio of a desired output signal having an amplitude modulation component. The efficiency of the power amplifier provides efficient amplification under the power back-off condition. In order to extend the dynamic range of the power amplifier circuitry to accommodate numerous output power levels, the DC-DC converter is used to control the variable supply voltage provided to the power amplifier circuitry. By controlling the variable supply voltage, the DC-DC converter controls the output power level of the power amplifier such that the power amplifier circuitry operates close to saturation for each output power level, thereby improving the efficiency of the power amplifier circuitry.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention provides a system and method for efficiently amplifying a radio frequency signal. In general, the system includes power amplifier circuitry, such as a Doherty or out-phasing amplifier, that efficiently amplifies an input signal at backed-off output power levels and a DC-DC converter that controls a variable supply voltage provided to the power amplifier circuitry. Note that an out-phasing amplifier configuration is also referred to herein as a Chireix amplifier configuration. In general, the DC-DC converter is used to control the variable supply voltage provided to the power amplifier circuitry such that the power amplifier circuitry operates close to saturation for each output power level, thereby improving the efficiency of the power amplifier circuitry.

The present invention recognizes that the total dynamic range of the power amplifier circuitry has two components: a fast changing component due to an amplitude modulation component of the input signal and a slow changing component due to output power level control, battery variations, and process and temperature variations. Since the power amplifier circuitry must operate under backed-off power conditions in order to accommodate amplitude modulation and prevent distortion of the output signal, traditional amplifiers do not provide efficient amplification. The efficiency of the power amplifier configurations, such as the Doherty configuration and the Chireix configuration, provides efficient amplification under backed-off power conditions, thereby providing efficient amplification for the amplitude modulation component of the dynamic range. The DC-DC converter controls the supply voltage provided to the power amplifier circuitry to provide efficient amplification for the slow changing component of the dynamic range.

Figure 2:
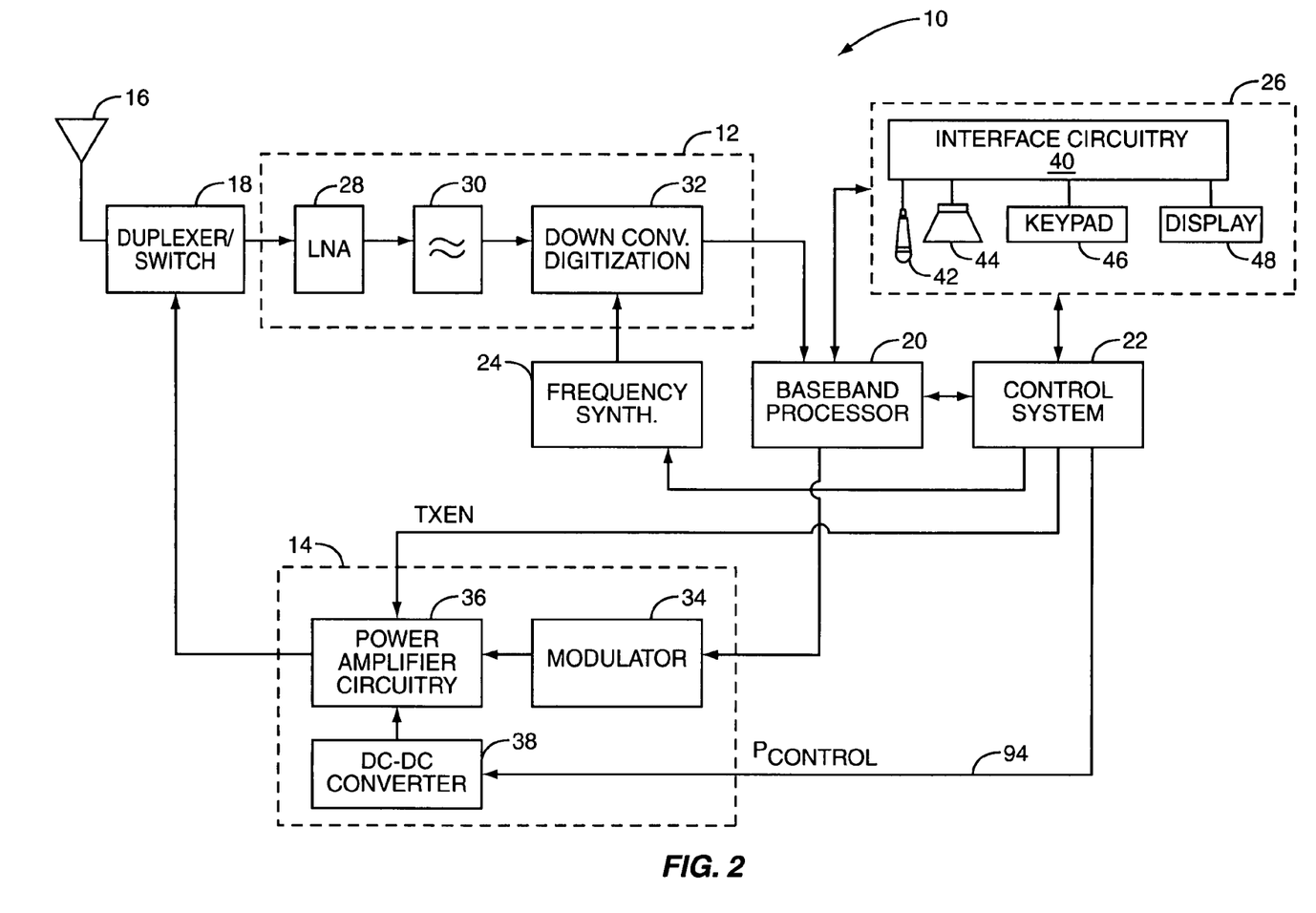
FIG. 2 illustrates an exemplary mobile terminal including power amplifier circuitry and a DC-DC converter operating according to one embodiment of the present invention.

The present invention is preferably incorporated in a mobile terminal 10, such a mobile telephone, personal digital assistant, or the like. The basic architecture of a mobile terminal 10 is represented in FIG. 2 and may include a receiver front end 12, a radio frequency transmitter section 14, an antenna 16, a duplexer or switch 18, a baseband processor 20, a control system 22, a frequency synthesizer 24, and an interface 26. The receiver front end 12 receives information bearing radio frequency signals from one or more remote transmitters provided by a base station. A low noise amplifier 28 amplifies the signal. A filter circuit 30 minimizes broadband interference in the received signal, while a downconverter 32 downconverts the filtered, received signal to an intermediate or baseband frequency signal, which is then digitized into one or more digital streams. The receiver front end 12 typically uses one or more mixing frequencies generated by the frequency synthesizer 24.

The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The encoded data is output to the radio frequency transmitter section 14, where it is used by a modulator 34 to modulate a carrier signal that is at a desired transmit frequency. Power amplifier circuitry 36 amplifies the modulated carrier signal to a level appropriate for transmission from the antenna 16. According to the present invention, the power amplifier circuitry 36 is a power amplifier such as a Doherty amplifier or Chireix amplifier having efficiencies greater than a traditional amplifier under power back-off conditions.

As described in further detail below, an output power level of the power amplifier circuitry 36 is controlled by a power control signal ($P_{CONTROL}$). More specifically, the DC-DC converter 38 provides a variable supply voltage to the power amplifier circuitry 36 and is controlled using the power control signal ($P_{CONTROL}$). The variable supply voltage controls the output power level, or average output power, of the power amplifier circuitry 36. The DC-DC converter 38 is controlled such that the variable supply voltage provided to the power amplifier circuitry 36 is controlled such that the power amplifier circuitry 36 operates close to saturation for each output power level, thereby improving the efficiency of the power amplifier circuitry 36.

A user may interact with the mobile terminal 10 via the interface 26, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20.

The microphone 42 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 44 by the I/O and interface circuitry 40. The keypad 46 and display 48 enable the user to interact with the mobile terminal 10, input numbers to be dialed, address book information, or the like, as well as monitor call progress information.

Figure 3:
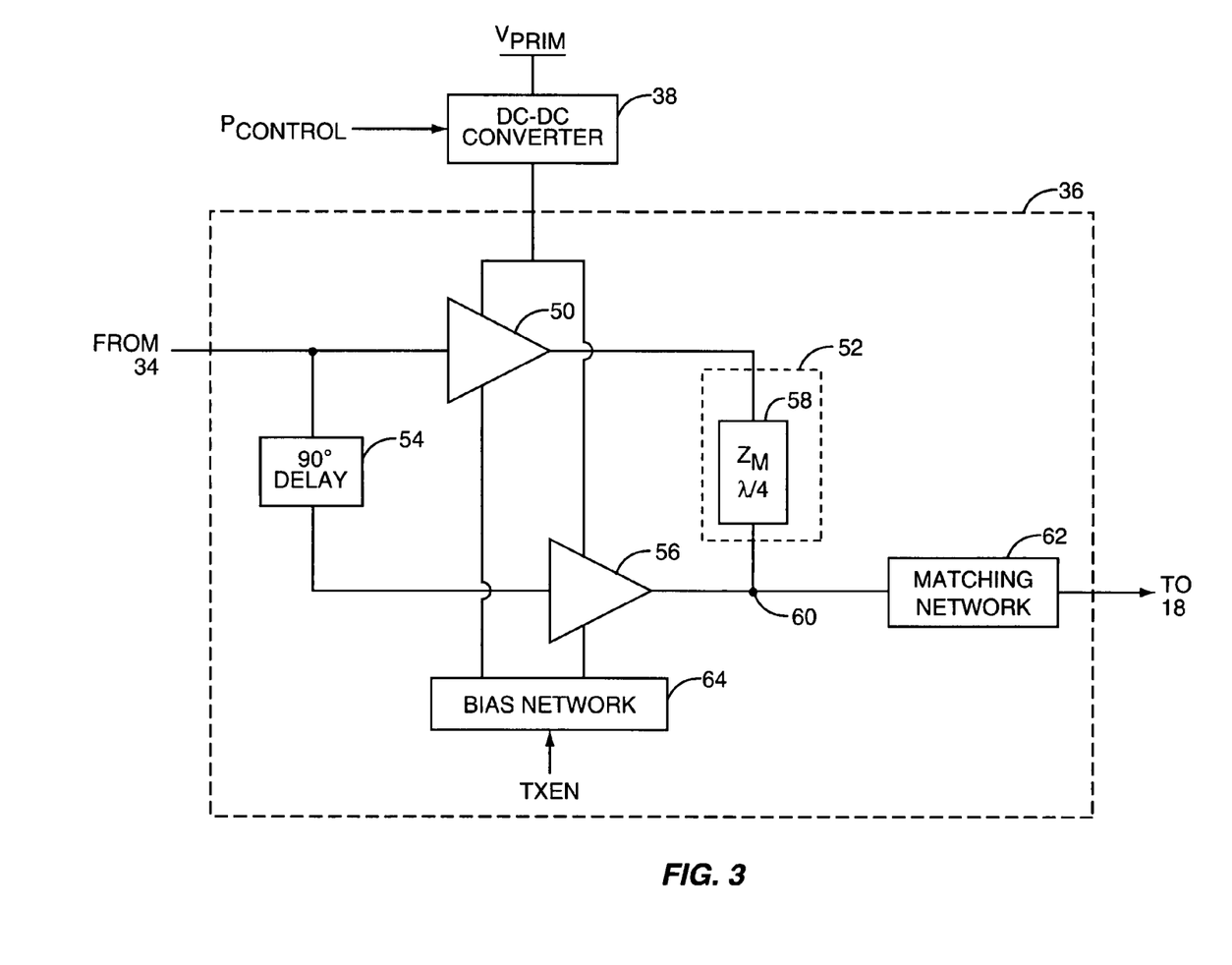
FIG. 3 illustrates an exemplary embodiment of the power amplifier circuitry of FIG. 2 configured in a Doherty amplifier arrangement.

FIG. 3 illustrates an exemplary embodiment of the power amplifier circuitry 36 and the associated DC-DC converter 38 according to one embodiment of the present invention. It should be noted that the power amplifier circuitry 36 and the DC-DC converter 38 may be incorporated into a single module. In this embodiment, the power amplifier circuitry 36 is configured in a Doherty amplifier arrangement.

In general, the power amplifier circuitry 36 includes a main branch formed by main amplifier 50 and impedance (Z) inverter circuitry 52, and a peaking, or auxiliary, branch formed by delay circuitry 54 and peaking amplifier 56. The impedance inverter circuitry 52 is alternatively referred to as an impedance transformer. The main and peaking branches are arranged in parallel and operate essentially 90 degrees out-of-phase. More specifically, a radio frequency input signal from the modulator 34 (FIG. 2) is provided to the main amplifier 50 and the delay circuitry 54. Note that the main amplifier 50 and the peaking amplifier 56 may include one or more driver stages or one or more driver amplifier stages (not shown) may be connected in series between the modulator 34 and the input of the main amplifier 50 and the delay circuitry 54 in order to amplify the radio frequency input signal from the modulator 34 to a desired level. The delay circuitry 54 delays the radio frequency input signal such that the delayed version of the radio frequency input signal provided to the peaking amplifier 56 is essentially 90 degrees out-of-phase with the radio frequency input signal provided to the main amplifier 50. In one embodiment, the delay circuitry 54 is a quarter wave transmission line. Alternatively, the radio frequency input signal may be provided to a quadrature splitter, which is also referred to as a 90 degree hybrid, where an in-phase output of the quadrature splitter is provided to the main amplifier 50, and the quadrature-phase output of the quadrature splitter is provided to the peaking amplifier 56.

The output of the main amplifier 50 is provided to the impedance inverter circuitry 52, which adjusts the phase of the output signal from the main amplifier 50 such that the output of the impedance inverter circuitry 52 is in-phase with the output of the peaking amplifier 56. In one embodiment, the impedance inverter circuitry 52 is a quarter wave transmission line 58 having a characteristic impedance, $Z_M$. The impedance inverter circuitry 52 operates as an active load such that the loads seen by the main and peaking amplifiers 50 and 56 are dependent on the radio frequency currents provided by the main and peaking amplifiers 50 and 56. The outputs of the main branch and peaking branch are combined at node 60 to provide an amplified radio frequency signal to the antenna 16 (FIG. 2) via matching network 62 for transmission.

Bias network 64 operates to bias the base or gate of the main and peaking amplifiers 50 and 56 such the main amplifier 50 is active and the peaking amplifier 56 is inactive when the amplitude of the radio frequency input signal is less than a threshold level corresponding to a predetermined back-off point, and both the main and peaking amplifiers 50 and 56 are active when the amplitude of the radio frequency input signal is greater than the threshold level. Thus, main amplifier 50 may be biased in class B, and the peaking amplifier 56 may be biased in class C. In one embodiment, the predetermined back-off point is 6 dB less than a maximum output power for the desired output power level. In addition, the bias network 64 may be controlled by a transmit enable signal (TXEN) such that the power amplifier circuitry 36 is active when the transmit enable signal (TXEN) is in a first state and inactive when the transmit enable signal (TXEN) is in a second state.

While the Doherty configuration appears to be a 90 degree balanced amplifier, it is in fact an active load pull system where the radio frequency current output from the peaking amplifier 56 affects the load presented to the main amplifier 50, and vice versa. In operation, the main and peaking amplifiers 50 and 56 are working in concert and driving a load of, for example, approximately 4 ohms with very high efficiency at the maximum output power level. At a predetermined backoff point, such as a 6 dB backoff from the maximum output power, the peaking amplifier 56 is inactive and the main amplifier 50 is driving a load of, for example, approximately 8 ohms with very high efficiency.

Assuming a symmetric configuration and that the characteristic impedance, $Z_M$, of the quarter wave transmission line 58 is two times a load impedance seen at the output of the power amplifier circuitry 36, the load impedances seen by the main and peaking amplifiers 50 and 56 at the maximum output power level may be defined as:

$R_{MAIN} = 2R_L$, and $R_{PEAKING} = 2R_L$, where $R_{MAIN}$ is the load seen by the main amplifier 50, $R_{PEAKING}$ is the load seen by the peaking amplifier 56, and $R_L$ is the load impedance at the output of the power amplifier circuitry 36. The load impedances seen by the main and peaking amplifiers 50 and 56 when operating below the 6 dB backoff point may be defined as:

$R_{MAIN} = 4R_L$, and $R_{PEAKING} \approx \infty$.

When operating at a point between the 6 dB backoff point and the maximum output power, both the main and peaking amplifiers 50 and 56 are active and the load impedance may be defined as:

$$R_{MAIN} = \frac{2R_L}{i_{MAIN}/i_{MAX}}, \text{ and } R_{PEAKING} = \frac{R_L(i_{MAIN}/i_{MAX})}{i_{MAIN}/i_{MAX} - 1/2},$$

where $i_{MAIN}$ is the current output by the main amplifier 50 and $i_{MAX}$ is the maximum output current provided by the main and peaking amplifiers 50 and 56 at the maximum output power level.

In operation, the DC-DC converter 38 operates to control the variable supply voltage provided to the main and peaking amplifiers 50 and 56 to control the output power level, or average output power, of the power amplifier circuitry 36. The variable supply voltage is at a highest output power level for the maximum output power level and at a lowest output power level for the minimum output power level. By controlling the variable supply voltage such that it is reduced to reduce the output power level, the power amplifier circuitry 36 operates close to saturation for each output power level, thereby improving the efficiency of the power amplifier circuitry 36.

Figure 4:
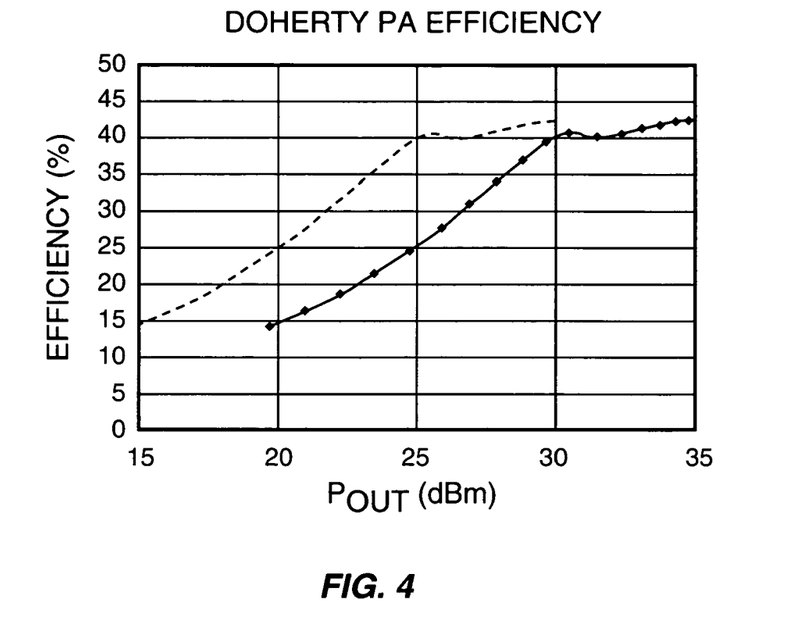
FIG. 4 illustrates an exemplary efficiency versus output power characteristic of the power amplifier circuitry of FIG. 3.

More specifically, FIG. 4 illustrates an exemplary efficiency versus output power curve for the Doherty configuration of FIG. 3. The solid line, or curve, is for a maximum output power level. Assuming that the desired output signal provided by the power amplifier circuitry 36 has a 6 dB peak-to-average ratio, then the bias network 64 (FIG. 3) operates to bias the main and peaking amplifiers 50 and 56 (FIG. 3) such that the average output power is approximately 30 dB for the maximum output power level. This provides the 6 dB headroom needed to accommodate the 6 dB peak-to-average ratio of the output signal without distortion. For an average output power of 30 dB, the power amplifier circuitry 36 operates at approximately 40% efficiency, as compared to less than 30% efficiency for a typical power amplifier (see FIG. 1).

To reduce the output power level, or average output power, the DC-DC converter 38 is controlled to reduce the variable supply voltage provided to the power amplifier circuitry 36. Note that the variable supply voltage is controlled to control the output power level, or average output power, of the power amplifier circuitry 36. As a result, the efficiency of the power amplifier circuitry 36 is increased for the reduced output power level. For example, if the output power level is reduced such that the average output power is reduced from 30 dB to 25 dB, the efficiency of the Doherty amplifier would traditionally reduce to approximately 25%. However, according to the present invention, the variable supply voltage provided to the power amplifier circuitry 36 is reduced to reduce the output power level. Thus, in essence, the curve of FIG. 4 is shifted to the left, as indicated by the dashed line. So, if it is desired to reduce the output power level such that the average output power is 25 dB, then the variable supply voltage is reduced from a first value to a second value, thereby reducing the output power level and, in essence, shifting the curve of FIG. 4 to the left. As a result, the efficiency of the power amplifier circuitry 36 is approximately 40% rather than 25%. Further, there is still 6 dB of headroom to accommodate the peak-to-average ratio of the output signal.

Figure 5:
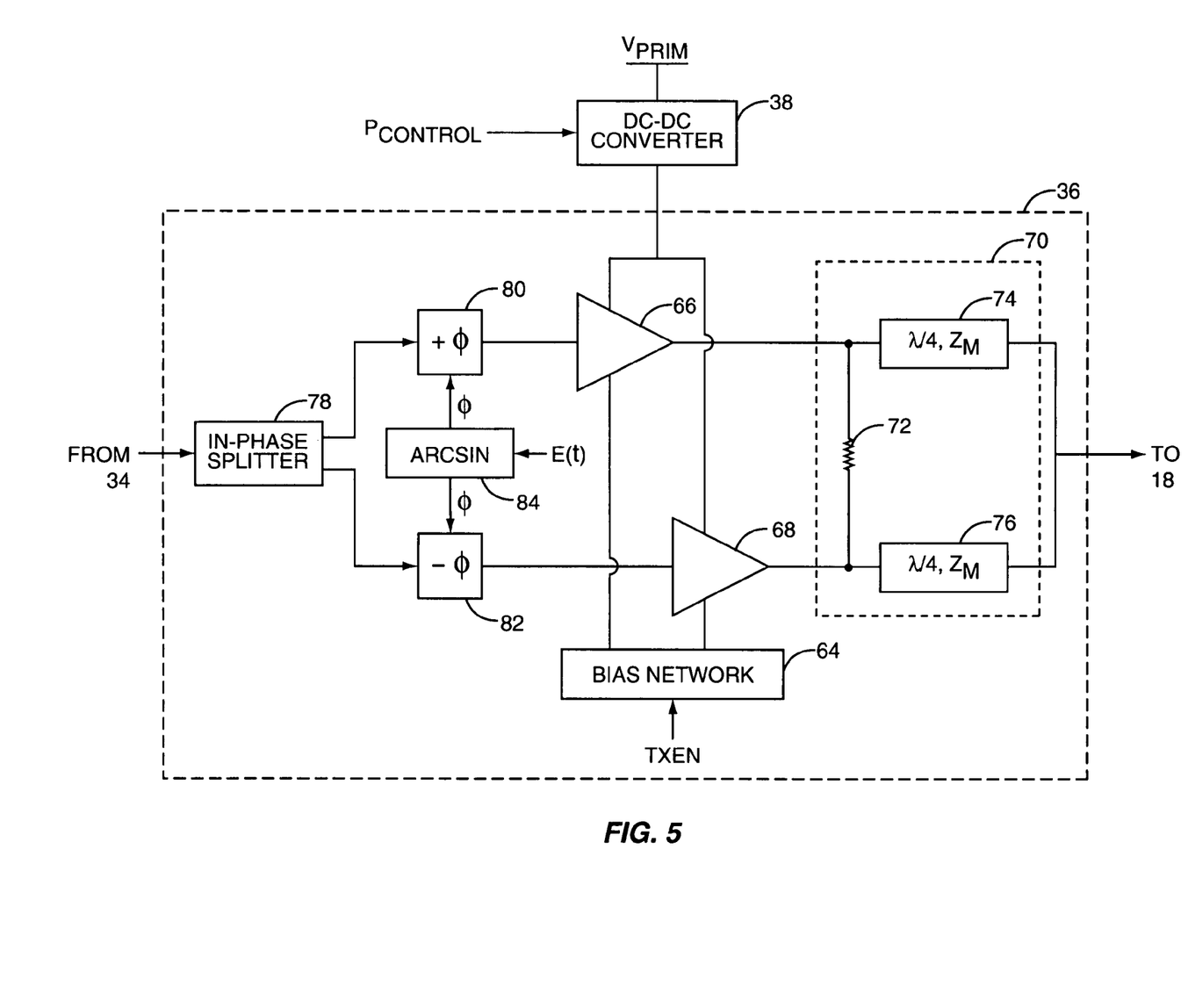
FIG. 5 illustrates an exemplary embodiment of the power amplifier circuitry of FIG. 2 configured in a Chireix amplifier arrangement.

FIG. 5 illustrates another exemplary embodiment of the power amplifier circuitry 36 of the present invention. In general, the DC-DC converter 38 operates to control the variable supply voltage provided to the power amplifier circuitry 36 in order to control the output power level and improve the efficiency of the power amplifier circuitry 36, as described above. However, in this embodiment, the power amplifier circuitry 36 is implemented in an out-phasing, or Chireix, amplifier configuration rather than a Doherty configuration.

In this embodiment, the power amplifier circuitry 36 includes a first amplifier 66 and a second amplifier 68 operating in parallel. The outputs of the first and second amplifiers 66 and 68 are combined by combiner circuitry 70 to provide an output signal. As illustrated, the combiner circuitry 70 includes a resistor 72 and quarter wave transmission lines 74 and 76. By time-varying the phases of the input signals provided to the first and second amplifiers 66 and 68, the output signal may have a desired amplitude modulation component. More specifically, in this embodiment, a radio frequency input signal is provided to an in-phase splitter 78 from the modulator 34 (FIG. 2). The radio frequency input signal has a constant envelope and may have a phase modulation component. The in-phase splitter 78 splits the radio frequency input signal into two in-phase signals. One of the in-phase signals is provided to phase adjuster 80 and the other of the in-phase signals is provided to phase adjuster 82.

The phase adjuster 80 applies a positive phase shift (+$\phi$) to the in-phase signal, and the phase adjuster 82 applies a negative phase shift (−$\phi$) to the other in-phase signal. The desired phase shift ($\phi$) is provided based on determining the arcsine of a desired envelope E(t). The desired envelope E(t) may be an amplitude modulation component or a fixed value when no amplitude modulation is desired. When there is an amplitude modulation component, arcsin circuitry 84 provides the desired phase shift ($\phi$) by determining arcsin(E(t)) such that the desired phase shift ($\phi$) is a time-varying phase shift. Then, by adjusting the relative phases of the two in-phase signals from the in-phase splitter 78, the output signal provided by the power amplifier circuitry 36 has the desired amplitude modulation component.

Figure 6:
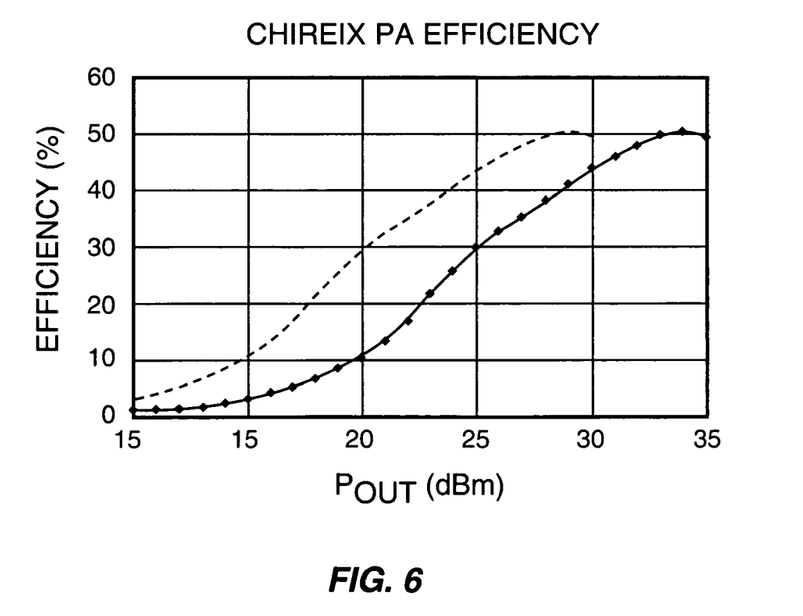
FIG. 6 illustrates an exemplary efficiency versus output power characteristic of the power amplifier circuitry of FIG. 5.

FIG. 6 illustrates an exemplary efficiency versus output power curve for a Chireix amplifier configuration for a maximum output power level. Assuming that the output signal provided by the power amplifier circuitry 36 has a 6 dB peak-to-average ratio, then the bias network 64 (FIG. 5) operates to bias the first and second amplifiers 66 and 68 (FIG. 5) such that the average output power is approximately 30 dB for the maximum output power level. This provides the 6 dB headroom needed to accommodate the 6 dB peak-to-average ratio. As such, the power amplifier circuitry 36 operates at approximately 45% efficiency, as compared to less than 30% efficiency for a typical power amplifier (see FIG. 1).

When it is desired to reduce the output power level from the maximum output power level to a reduced output power level, the DC-DC converter 38 (FIG. 5) is controlled such that the variable supply voltage provided to the power amplifier circuitry 36 is reduced. As a result, the output power level, or average output power, of the power amplifier circuitry 36 is reduced and the efficiency of the power amplifier circuitry 36 is increased. For example, if the output power level is reduced such that the average output power is reduced from 30 dB to 25 dB, the efficiency of the Chireix amplifier would reduce to approximately 30%. However, according to the present invention, the variable supply voltage provided to the power amplifier circuitry 36 is reduced to control the output power level. Thus, in essence, the curve of FIG. 6 is shifted to the left, as indicated by the dashed line. So, if the variable supply voltage is reduced such that the output power level, or average output power, is reduced to 25 dB, then the variable supply voltage is reduced from a first value to a second value, thereby, in essence, shifting the curve of FIG. 6 to the left. As a result, the efficiency of the power amplifier circuitry 36 is approximately 45% rather than 30%.

The present invention provides substantial opportunity for variation without departing from the spirit or scope of the present invention. For example, the Doherty configuration of FIG. 3 and the Chireix configuration of FIG. 5 are exemplary and should not limit the scope of the present invention. More specifically, numerous variations to the Doherty configuration and the Chireix configuration will be apparent to one of ordinary skill in the art upon reading this disclosure. Also, the present invention is equally applicable to any power amplifier configuration having high efficiency under power back-off conditions. For example, any power amplifier configuration having at least 30% efficiency at a 6 dB back-off point may be used for the present invention.

Those skilled in the art will recognize improvements and modifications to the preferred embodiments of the present invention. All such improvements and modifications are considered within the scope of the concepts disclosed herein and the claims that follow.

What is claimed is:

1. A system comprising:
 a) power amplifier circuitry having at least 30% efficiency at a 6 dB back-off point and adapted to:
  i) receive a variable supply voltage controlling an output power level of the power amplifier circuitry; and
  ii) amplify an input signal to provide an amplified output signal; and
 b) DC-DC conversion circuitry adapted to provide the variable supply voltage based on a control signal, wherein the control signal is provided to control the variable supply voltage such that power amplifier circuitry operates near saturation for each of a plurality of output power levels.

2. The system of claim 1 wherein the power amplifier circuitry is configured in a Doherty amplifier arrangement.

3. The system of claim 1 wherein the power amplifier circuitry is configured in a Chireix amplifier arrangement.

4. The system of claim 1 wherein the power amplifier circuitry comprises:
 main amplifier circuitry adapted to receive the variable supply voltage and amplify the input signal to provide a first signal;
 delay circuitry adapted to receive the input signal and delay the input signal to provide a delayed input signal that is essentially ninety degrees out-of-phase with the input signal;
 peaking amplifier circuitry coupled to an output of the delay circuitry and adapted to receive the variable supply voltage and amplify the delayed input signal to provide a second signal;

combiner circuitry adapted to combine the first and second signals to provide the amplified output signal; and biasing circuitry adapted to bias the main amplifier circuitry and the peaking amplifier circuitry such that the main amplifier circuitry is active and the peaking amplifier circuitry is inactive when an amplitude of the input signal is less than a predetermined threshold, and both the main amplifier circuitry and the peaking amplifier circuitry are active when the amplitude of the input signal is greater than the predetermined threshold.

5. The system of claim 4 wherein the combiner circuitry is a quarter wave transmission line having a first terminal coupled to an output of the main amplifier circuitry and a second terminal coupled to an output of the peaking amplifier circuitry.

6. The system of claim 1 wherein the power amplifier circuitry comprises:

first amplifier circuitry adapted to amplify a first phase-shifted version of the input signal to provide a first output signal;

second amplifier circuitry adapted to amplify a second phase-shifted version of the input signal to provide a second output signal;

combiner circuitry adapted to combine the first and second output signals to provide the amplified output signal; and phase shift circuitry adapted to receive the input signal and apply a positive time-varying phase shift to the input signal to provide the first phase-shifted version of the input signal and apply a negative time-varying phase shift to the input signal to provide the second phase-shifted version of the input signal, wherein the positive and negative time-varying phase shifts are provided such that the amplified output signal has a desired envelope.

7. The system of claim 1 wherein the power amplifier circuitry further comprises bias circuitry adapted to bias the power amplifier circuitry such that an average output power of the power amplifier circuitry is less than a maximum output power of the power amplifier circuitry for each of a plurality of output power levels by at least a desired peak-to-average ratio of the amplified output signal.

8. A method comprising:

amplifying an input signal to provide an amplified output signal using power amplifier circuitry having at least 30% efficiency at a 6 dB back-off point; and providing a variable supply voltage to the power amplifier circuitry using DC-DC conversion circuitry to control an output power level of the power amplifier circuitry such that the power amplifier circuitry operates close to saturation for each of a plurality of output power levels.

9. The method of claim 8 further comprising providing the power amplifier circuitry in a Doherty amplifier arrangement.

10. The method of claim 8 further comprising providing the power amplifier circuitry in a Chireix amplifier arrangement.

11. The method of claim 8 wherein amplifying the input signal comprises:

providing main amplifier circuitry adapted to receive the variable supply voltage and amplify the input signal to provide a first signal;

providing delay circuitry adapted to receive the input signal and delay the input signal to provide a delayed input signal that is essentially ninety degrees out-of-phase with the input signal;

providing peaking amplifier circuitry coupled to an output of the delay circuitry and adapted to receive the variable supply voltage and amplify the delayed input signal to provide a second signal;

providing combiner circuitry adapted to combine the first and second signals to provide the amplified output signal; and providing biasing circuitry adapted to bias the main amplifier circuitry and the peaking amplifier circuitry such that the main amplifier circuitry is active and the peaking amplifier circuitry is inactive when an amplitude of the input signal is less than a predetermined threshold, and both the main amplifier circuitry and the peaking amplifier circuitry are active when the amplitude of the input signal is greater than the predetermined threshold.

12. The method of claim 11 wherein providing the combiner circuitry comprises providing a quarter wave transmission line having a first terminal coupled to an output of the main amplifier circuitry and a second terminal coupled to an output of the peaking amplifier circuitry.

13. The method of claim 8 wherein amplifying the input signal comprises:

providing first amplifier circuitry adapted to amplify a first phase-shifted version of the input signal to provide a first output signal;

providing second amplifier circuitry adapted to amplify a second phase-shifted version of the input signal to provide a second output signal;

providing combiner circuitry adapted to combine the first and second output signals to provide the amplified output signal; and providing phase shift circuitry adapted to receive the input signal and apply a positive time-varying phase shift to the input signal to provide the first phase-shifted version of the input signal and apply a negative time-varying phase shift to the input signal to provide the second phase-shifted version of the input signal, wherein the positive and negative time-varying phase shifts are provided such that the amplified output signal has a desired envelope.

14. The method of claim 8 further comprising biasing the power amplifier circuitry such that an average output power of the power amplifier circuitry is less than a maximum output power of the power amplifier circuitry for each of a plurality of output power levels by at least a desired peak-to-average ratio of the amplified output signal.

* * * * *